(12) United States Patent
Termanini

(10) Patent No.: US 10,403,777 B2
(45) Date of Patent: Sep. 3, 2019

(54) SOLAR PANEL WITH OPTICAL LIGHT ENHANCEMENT DEVICE

(71) Applicant: Joint Innovation Technology, LLC, Boca Raton, FL (US)

(72) Inventor: Zafer Termanini, Port Saint Lucie, FL (US)

(73) Assignee: JOINT INNOVATION TECHNOLOGY, LLC, Boca Raton, FL (US)

( * ) Notice: Subject to any disclaimer, the term of this patent is extended or adjusted under 35 U.S.C. 154(b) by 0 days.

(21) Appl. No.: 15/957,465

(22) Filed: Apr. 19, 2018

(65) Prior Publication Data

US 2018/0240926 A1 Aug. 23, 2018

Related U.S. Application Data

(63) Continuation of application No. 15/055,635, filed on Feb. 29, 2016, now abandoned.

(51) Int. Cl.
*H01L 31/054* (2014.01)
*H01L 31/042* (2014.01)

(52) U.S. Cl.
CPC ........ *H01L 31/0543* (2014.12); *H01L 31/042* (2013.01); *Y02E 10/52* (2013.01)

(58) Field of Classification Search
CPC ....... H01L 31/054–0543; H01L 31/042; Y02E 10/52
USPC .................................................. 136/243–265
See application file for complete search history.

(56) References Cited

U.S. PATENT DOCUMENTS

| 4,025,786 A | * | 5/1977 | Hamilton | H01L 31/042 136/244 |
| 4,167,937 A | * | 9/1979 | Bergkvist | F24S 23/30 126/698 |
| 4,200,472 A | * | 4/1980 | Chappell | H01L 31/052 136/246 |
| 7,875,793 B2 | | 1/2011 | Hsiao et al. | |
| 2004/0084077 A1 | * | 5/2004 | Aylaian | H01L 31/048 136/246 |
| 2008/0007295 A1 | | 3/2008 | Dutta | |
| 2008/0072958 A1 | * | 3/2008 | Dutta | H01L 31/0236 136/256 |
| 2009/0025779 A1 | | 1/2009 | Hsiao | |
| 2009/0095340 A1 | | 4/2009 | Hsiao et al. | |
| 2009/0205699 A1 | | 8/2009 | Chang | |

(Continued)

OTHER PUBLICATIONS

International Search Report for corresponding application PCT/US2017/017890 dated Apr. 19, 2017.

*Primary Examiner* — Liesl C Baumann
(74) *Attorney, Agent, or Firm* — Norris McLaughlin PA

(57) ABSTRACT

A double layered superimposed and parallel solar panels having an optical system comprising cylindrical rods and convex lenses at either end of said rods. Said optical rods are centrally longitudinally and transversely inserted in the upper panel through slits where sunlight rays pass and diffract through said rods and widely diffuse over the entire surface of the lower solar panel. A plurality of optical rods may be used thereby increasing the light transmission to the lower solar panel. The present invention significantly reduces the surface needed to install conventional residential as well as commercial solar panels.

8 Claims, 5 Drawing Sheets

(56) References Cited

U.S. PATENT DOCUMENTS

| | | | |
|---|---|---|---|
| 2009/0277496 A1* | 11/2009 | Khazeni | H01L 31/0543 |
| | | | 136/246 |
| 2010/0108133 A1 | 5/2010 | Adiseshaiah et al. | |
| 2011/0023866 A1* | 2/2011 | Balbo Di Vinadio | F24J 2/07 |
| | | | 126/600 |
| 2013/0048052 A1 | 2/2013 | Lam et al. | |
| 2013/0057959 A1 | 3/2013 | Fay et al. | |
| 2013/0294729 A1 | 11/2013 | Layton et al. | |
| 2014/0090687 A1* | 4/2014 | Den Boer | H02S 20/26 |
| | | | 136/246 |
| 2014/0209581 A1 | 7/2014 | Pawlowski et al. | |
| 2014/0268871 A1 | 9/2014 | Morgan et al. | |
| 2014/0299175 A1 | 10/2014 | Gilbert | |

* cited by examiner

SOLAR PANEL WITH OPTICAL LIGHT ENHANCEMENT DEVICE

This is a Continuation patent application of U.S. Ser. No. 15/055,635, filed 29 Feb. 2016.

FIELD OF THE INVENTION

The disclosure of this invention relates generally to solar energy panel, and more particularly as a double layered photovoltaic solar panel having light enhancement optical system.

BACKGROUND OF THE INVENTION

Solar panels have been commonly in use for several decades. Photovoltaic panels convert light into electricity at the atomic level. French physicist, Edmond Becquerel in 1839, found that certain materials would produce small electric current when exposed to light. Later, Albert Einstein in 1905 described in detail the photoelectric effect of certain materials when exposed to light cause them to absorb photons of light and release electrons. When these free electrons are absorbed and captured by adjacent substrate, an electric current results that can be used as electricity. Bell Laboratories built the first photovoltaic module in 1954. It is not until the mid sixties that the space industry began to make the first serious use of the technology to provide power aboard spacecraft. Later, in the early 1970, the photovoltaic technology gained popularity and recognition during the energy crisis.

Basically photovoltaic cells, also called solar cell, are made of a semiconductor material, such as specially treated silicone, which is wafered between two electrical conductor surfaces. When sunlight strikes the top surface, electrons will be released and captured in a form of electric current, which can be used electricity.

A number of solar cells are usually connected to each other and mounted in a support structure or frame is called Photovoltaic module. Furthermore, large numbers of modules are electrically connected to form large solar panels or array. Said array can be mounted in large number in open fields generating considerable amount of direct current electricity.

Due to limited space in urban backyards or house roofs, the number of panels required for a particular residential or commercial project can be limited due to small available surface. The present invention overcomes such limitation by providing double-layered solar panels. A major improvement provided by the present invention is a double-layered solar panel whereby the sun light beams strikes the first top layer and significant portion of said beam will penetrate the top layer through longitudinal and transverse slots having cylindrical lenses, which will diverge the incoming light onto the second lower panel. While the conventional devices may be suitable for the particular purpose to which they address, they are not suitable for providing double-layered solar panels that deliver more electrical current while occupying same or smaller surfaces.

BRIEF DESCRIPTION OF THE INVENTION

In view of the forgoing surface limitation disadvantages inherent in the known type of conventional solar panels now present in the prior art, the present invention provides a new double-layered solar panel wherein the same can be utilized for providing more electrical output for the same light exposed surface of the solar panel. This improvement is accomplished by using light enhancement optical system consisting of cylindrical lenses having truncated ends. Said lenses will gather sun light from different direction and diffract and diffuse light onto the lower photovoltaic panel.

The general purpose of the present invention, which will be described subsequently in greater detail, is to provide a novice bi-layered solar panel having optical light enhancing system that will transmit light from the surface of the top solar panel onto the lower panel.

This novel feature is not anticipated, rendered obvious, suggested or even implied by any of the prior art, either alone or in any combination thereof. To attain this, the present invention generally comprises two solar panels superimposed and paralleled one on top of the other at a variable distance according to the size of the cylindrical lenses of the optical system. Said upper solar panel having longitudinal opening in a form of slots where said cylindrical lenses are laid in and firmly attached hereto. Sunlight will be collected by the cylindrical lenses and pass through the longitudinal slots to be diffracted and spread onto the lower solar panel. Furthermore, truncation on either ends of the cylindrical rod will act as lenses and further gather ambient light, which will be collected by the rod and transmitted onto the lower solar panel.

There are additional features of the invention that will be described hereinafter. In this respect, before explaining at least one embodiment of the invention in detail, it is to be understood that the invention is not limited in its application to the details of construction and to the arrangement of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

To the accomplishment of the above described and related objects, this invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

Various other objects, features and attendant advantages of the present invention will become fully appreciated as the same becomes better understood when considered in conjunction with the accompanying drawings, in which like references characters designate the same or similar parts throughout the several views, and wherein.

DETAILED DESCRIPTION OF THE INVENTION

Figure 1:
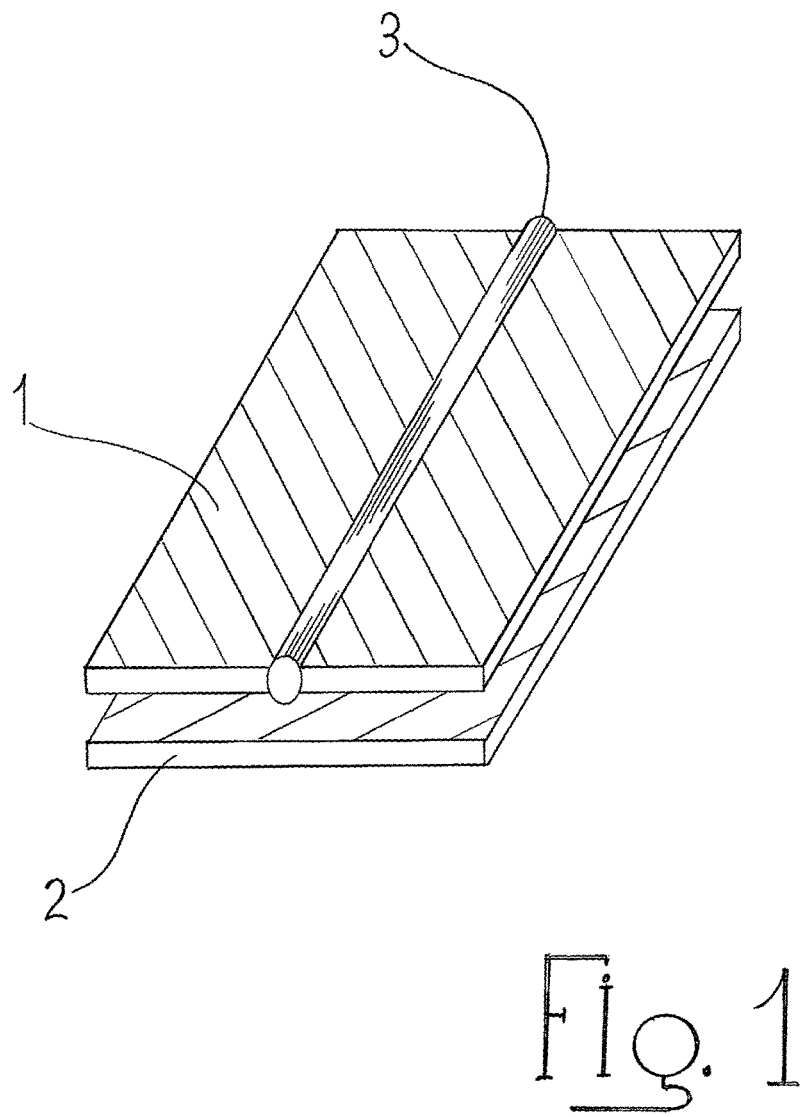
FIG. 1 is a perspective view of the double layered solar panel and longitudinal cylindrical lens.

Turning now descriptively to the drawings, in which similar references characters denote similar elements throughout the several views, the attached figures illustrate a double-layered solar panel, which comprises two superimposed solar panels 1 and 2. Said panels are placed in parallel configuration as seen in FIG. 1. The top solar panel has at least one longitudinal slot where optical cylindrical rod 3 in firmly secured. In addition, said top solar panel comprises at least one transverse slot where optical cylindrical rods 14 and 15, one on either side of the longitudinal rod in a form of a cross (as seen in FIG. 1), are firmly secured to the top solar panel. The number of longitudinal and transverse rods may vary according to the size of the solar panel 1.

Figure 2:
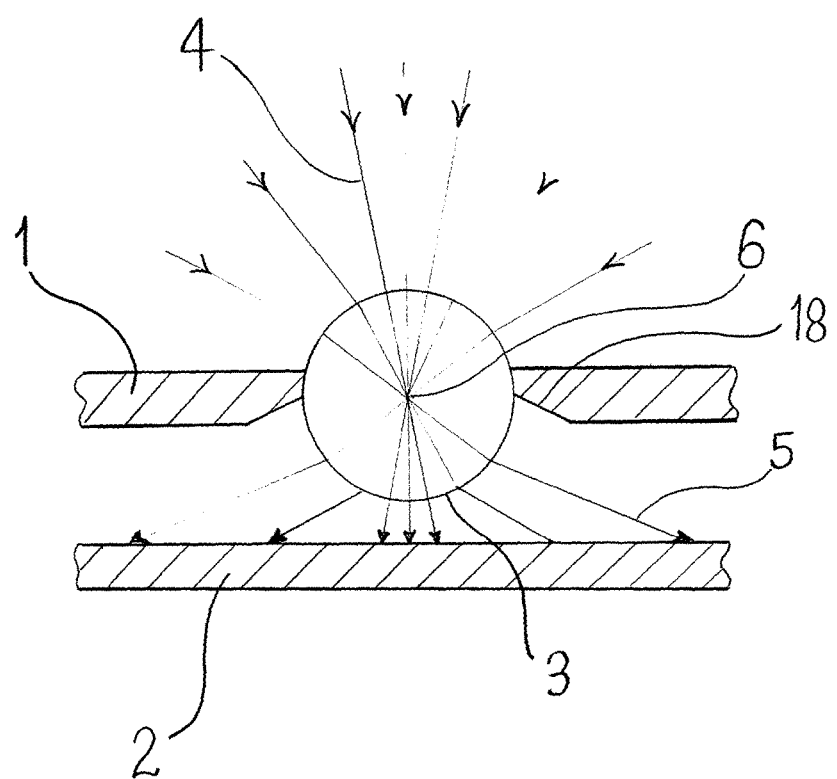
FIG. 2 is a cross sectional view of the double layered solar panel and diffraction of the striking sun rays onto the lower solar panel.
Figure 3:
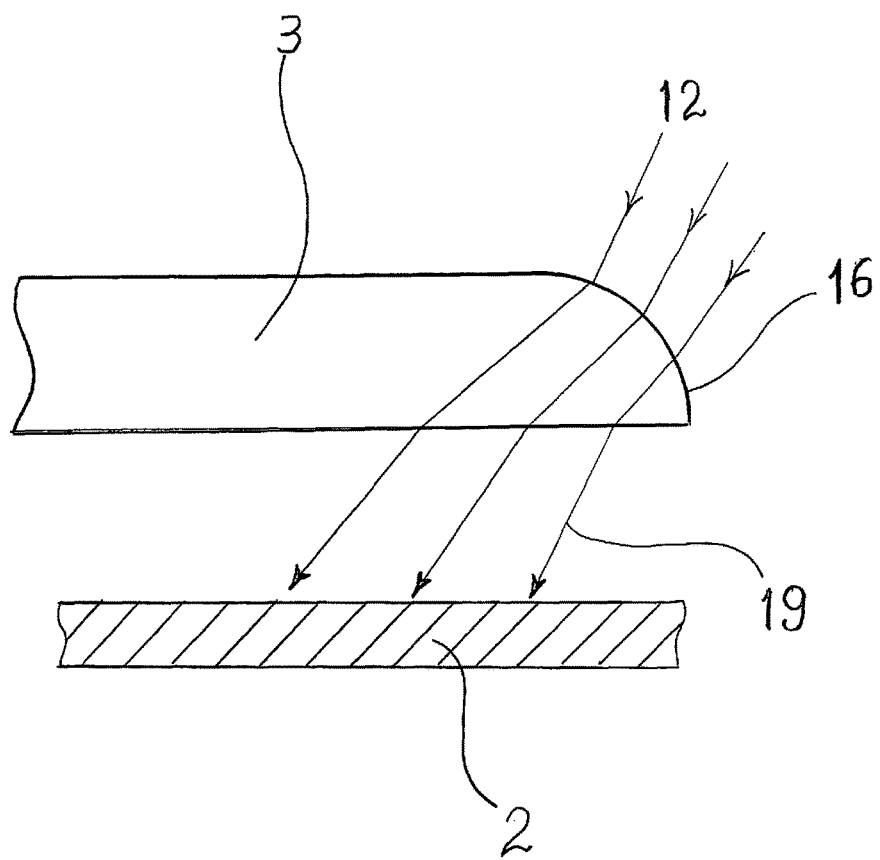
FIG. 3 is a cross section of trunked lens at end of optical rod and refraction of light.
Figure 4:
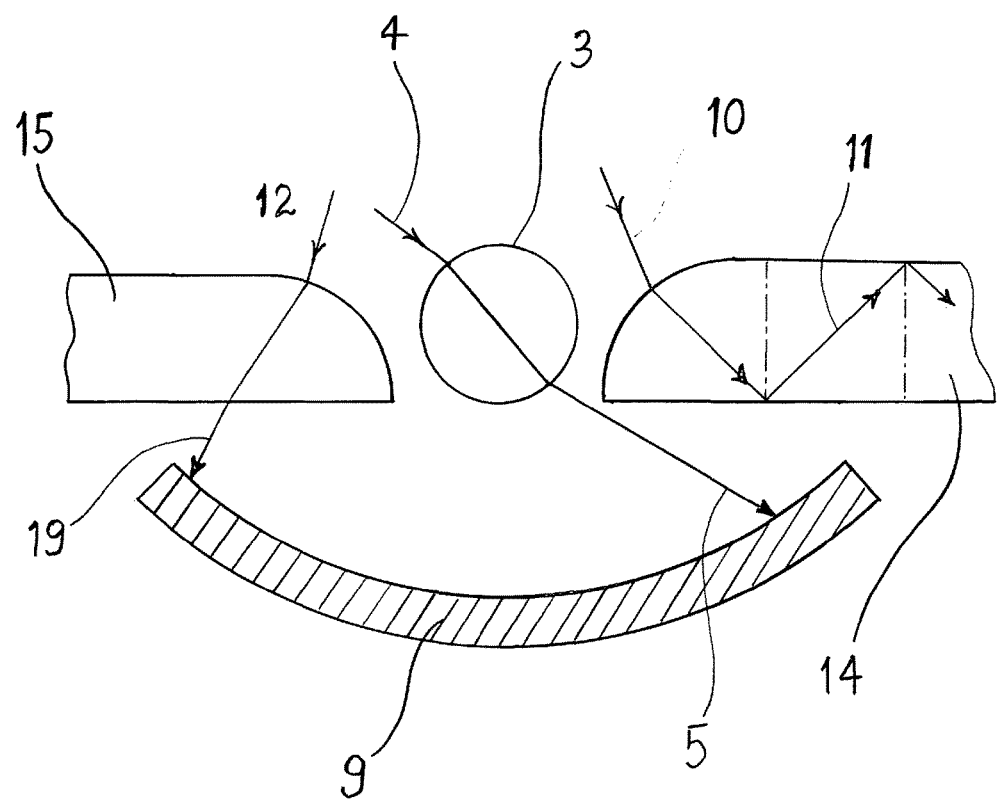
FIG. 4 is a sectional view at the intersection of transverse and longitudinal optical rod revealing the diffraction and reflection of incident light rays as well as the curved lower solar panel
Figure 5:
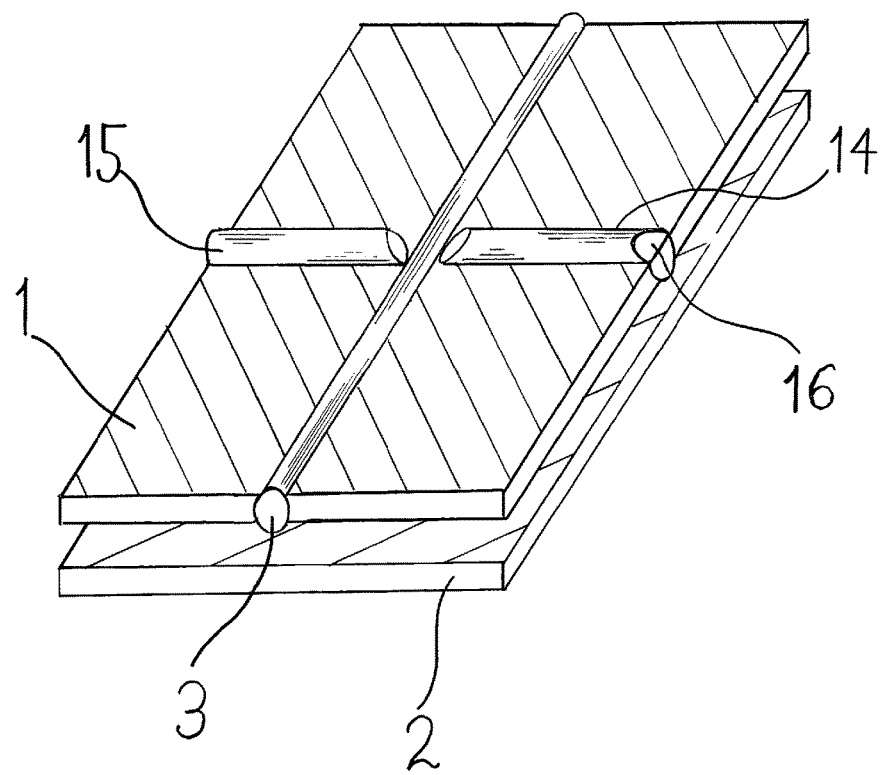
FIG. 5 is a perspective view of the double layered solar panel with longitudinal and transverse optical rods with optical truncation at end of transverse rod.

When sunlight rays 4 strike the round surface of the cylinder rod 3 they become refracted an exit as indirect rays 5 at a divergent angle reaching outer surfaces of the lower solar panel that otherwise cannot be exposed to sunrays (FIG. 2). It is further understood that said transverse rods 14 and 15 having a slant or truncation 16 on either side, thereby forming convex optical lenses that will gather incident sunlight rays 12 (FIG. 4) from a different angle and refract them onto the lower solar panel as indirect beam 19. It is to be noted that some incident rays 10, when they approach the slant lens at certain oblique angle will become reflected rays 11 (FIG. 4) inside the rod lens and ultimately end up projected onto the lower solar panel. It is further understood that the diameter of the cylinder rods may vary with size of the solar panel as well as the distance between the upper and the lower solar panels.

A variation of the present invention may include a different embodiment where the above described cylindrical rods have two flat parallel sides, or have an oval cross sectional geometry in order to compensate excessive thickness of the upper solar panel. In that regard a small bevel 18 would increase the angle of light projection allowing refracted light rays 5 to reach out further on the lower solar panel. In a different embodiment, the lower panel may be curved or even semi circular 9 (FIG. 4) in order to shorten the distance between the edge of the lower panel and the central optical rod. Said rods can be made from multiple array of material but not limited to optical quality material such as quartz, Pyrex or Borosilicate. Other hard plastic materials such as polycarbonate or fluorocarbonate may also be used.

As to a further discussion of the manner of usage and operation of the present invention, the same should be apparent from the above description. With respect to the above description then, it is to be realized that the optimum dimensional relationships for the parts of the invention, to include variation in size, materials, shape, form, function and manner of operation, assembly and use, are readily apparent and obvious to one skilled in the and all equivalent relationships to those illustrated in the drawings and described in the specification are intended to be encompassed by the present invention. Therefore, the foregoing is considered as illustrative only of the principles of the invention. Furthermore, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed:

1. A modular photovoltaic assembly operative in converting sunlight rays into electrical current comprising:
    an upper photovoltaic panel, said upper photovoltaic panel having a longitudinal slot, or having a longitudinal slot with two transverse slots, each of said slots within and extending through the upper photovoltaic panel;
    a lower photovoltaic panel spaced apart from said upper photovoltaic panel; and
    an optical cylindrical rod lens disposed and attached within each of the slots present in the upper photovoltaic panel, wherein
    only a first part of each lens extends above a top surface of the upper photovoltaic panel, and only a second part of each lens extends below the upper photovoltaic panel,
    each lens operates such that sunlight rays striking the first part of the lens extending above the top surface of the upper photovoltaic panel are refracted when passing through the lens, and the refracted sunlight rays exit the lens from the second part of the lens which extends below the upper photovoltaic panel, the refracted sunlight rays exiting the lens at divergent angles onto the lower photovoltaic panel,
    the lower photovoltaic panel is positioned in parallel beneath the upper photovoltaic panel, and
    the longitudinal slot present extends across the entire length of the upper photovoltaic panel.

2. The assembly of claim 1, wherein each optical cylindrical rod lens present is made from glass, composite or plastic.

3. The assembly of claim 2, wherein the ends of each optical cylindrical rod lens present have the form of a convex lens.

4. The assembly of claim 2, wherein the ends of each optical cylindrical rod lens present have a flat slanted surface.

5. The assembly according to claim 1, wherein the longitudinal slot present has a tapered cross-sectional profile which is present on the underside of the upper photovoltaic panel.

6. The assembly according to claim 1, wherein the first part of each lens extending above the top surface of the upper photovoltaic panel is convex in shape.

7. The assembly according to claim 1, wherein the second part of each lens extending below the upper photovoltaic panel is convex in shape.

8. The assembly of claim 1, wherein the edges of the upper photovoltaic panel in the region adjacent to the optical cylindrical rod lens disposed in the longitudinal slot are tapered on the underside.

\* \* \* \* \*